United States Patent [19]

Hotta et al.

[11] Patent Number: 4,480,319
[45] Date of Patent: Oct. 30, 1984

[54] EMITTER COUPLED FLIP FLOP MEMORY WITH COMPLEMENTARY BIPOLAR LOADS

[75] Inventors: Atsuo Hotta, Higashiyamato; Yukio Kato, Kodaira, both of Japan

[73] Assignee: Hitachi, Ltd., Tokyo, Japan

[21] Appl. No.: 228,475

[22] Filed: Jan. 26, 1981

Related U.S. Application Data

[63] Continuation of Ser. No. 003,013, Jan. 12, 1979, abandoned.

[30] Foreign Application Priority Data

Jan. 25, 1978 [JP] Japan .................................. 53-6212

[51] Int. Cl.³ ...................... H01L 27/04; G11C 11/40
[52] U.S. Cl. ....................................... 365/155; 357/14; 357/44; 357/46; 357/50; 357/51; 357/36; 365/156; 307/455; 307/463
[58] Field of Search ...................... 365/154, 155, 156; 357/44, 46, 51, 50, 14, 36

[56] References Cited

U.S. PATENT DOCUMENTS

| | | | |
|---|---|---|---|
| 3,603,820 | 9/1971 | Schnenemann | 357/38 |
| 3,693,057 | 9/1972 | Wiedmann | 357/48 |
| 4,053,923 | 10/1977 | Kang | 357/92 |
| 4,323,913 | 4/1982 | Murrmann et al. | 357/51 |

OTHER PUBLICATIONS

Ernst et al., Siemens Forsch, –u. Entwickl, –Ber., vol. 6, No. 2, 1977 (Springer–Verlag, NY, 1977), pp. 86–91.

Primary Examiner—William D. Larkins
Attorney, Agent, or Firm—Antonelli, Terry & Wands

[57] ABSTRACT

Disclosed is a memory cell circuit including a pair of memory transistors having respective collectors and bases cross-coupled to each other, wherein load means connected to the collector of each one of said memory transistors comprises a parallel circuit of a load resistance and a transistor whose emitter and collector are connected to both ends of the load resistance and whose base is connected to the collector of the other of the memory transistors, thereby causing the readout currents of the memory cell circuit to be greater irrespective of increased load resistances.

4 Claims, 25 Drawing Figures

BASE-EMITTER VOLTAGE

EMITTER COUPLED FLIP FLOP MEMORY WITH COMPLEMENTARY BIPOLAR LOADS

This is a continuation of application Ser. No. 003,013 filed Jan. 12, 1979, now abandoned.

BACKGROUND OF THE INVENTION

The present invention relates to memory circuits. More particularly, it relates to a memory circuit adapted for a semiconductor integrated circuit.

As a memory cell employing bipolar transistors, an arrangement as shown in FIG. 1 has been known. The memory cell in the figure is of the current switching type, and is made up of transistors $Q_1$ and $Q_0$ for readout, whose emitters are respectively connected to two data lines $LD_1$ and $LD_0$, transistors $Q_1'$ and $Q_0'$ for sustaining information, load resistances $RC_1$ and $RC_0$, a constant current circuit 5 which causes an information sustaining current IST to flow, and Schottky barrier diodes or conventional pn-junction diodes for speed-up $D_1$ and $D_0$ which are respectively connected between a word line $X_1$ and the collectors of the transistors $Q_0$ and $Q_1$. The common connection point of the resistances $RC_1$ and $RC_0$ and the diodes $D_1$ and $D_0$ of the memory cell is connected through the word line $X_1$ to a transistor $QX_1$ for driving the word line, while the common connection point of the transistors $Q_1'$ and $Q_0'$ is connected to the constant current circuit 5 for causing the sustaining current IST to flow. Connected to the respective data lines $LD_1$ and $LD_0$ are constant current source circuits 3 and 4 for causing a readout current IR to flow and driver circuits (transistors $QS_1$, resistance $R_1$) and (transistor $QS_0$, resistance $R_0$) receiving a voltage VREF.

In the above circuit, the information is sustained in such a way that either of the information sustaining transistor $Q_1'$ or $Q_0'$ is in the "on" state. The constant current circuit 5 supplies the sustaining current IST to the transistor $Q_1'$ or $Q_0'$. During an information sustaining period, the potential of the word line $X_1$ is maintained at a low level by the transistor $QX_1$, and the base potentials of the transistors $Q_1$ and $Q_0$ are lower than those of the transistors $QS_1$ and $QS_0$ of the driver circuits. As a result, the transistors $Q_1$ and $Q_0$ are in the "off" state.

In reading out the information, the potential of the word line $X_1$ is made a high level in order that the base in the "on" state in the memory cell may become higher than the base potentials of the transistors $QS_1$ and $QS_2$ of the driver circuits and that the base potential of the transistor $Q_0'$ or $Q_1'$ in the "off" state may become lower than those of the transistors $QS_1$ and $QS_0$. As a result, either the transistor $Q_1$ or $Q_0$ of the memory cell attains the "on" state. The current IR of the constant current circuit 3 flows into the transistor $QS_1$ or the transistor $Q_1$ according to the stored content of the memory cell. Likewise, the current of the constant current circuit 4 flows into the transistor $Q_0$ or $QS_0$. As a result, a voltage according to the stored content of the memory cell appears across the collector resistance $R_1$ or $R_0$ of the transistor $QS_1$ or $QS_0$.

In writing the information, a potential difference is set between the base potentials of the transistors $QS_1$ and $QS_0$ according to the information to be written in. Owing to the potential difference, the current IR of the constant current circuit 3 or 4 flows into the transistor $Q_1$ or $Q_0$ to forcibly bring it into the "on" state.

The present memory cell is advantageous in that since the diodes $D_0$ and $D_1$ clamp the collector potentials of the transistors $Q_1$ and $Q_0$, the readout current IR can be made large, so the reading and writing at high speed are possible, and in that since the readout is executed through the emitters of the transistors of the memory cell, the sense can be constructed of a current switching type circuit, so the adaptability to an ECL (emitter coupled logic) circuit is good. Therefore, it is extensively used for memory cells of bipolar RAM's at present.

In most of the high-speed bipolar memories now in wide application, the degree of integration per chip is 1,024 bits or less. However, as the capacities of memory devices of computers have become large, the necessity for bipolar memories of or above 4,096 bits per chip has increased. In case where the prior-art memory cell shown in FIG. 1 is employed as the memory of or above 4,096 bits, a problem as stated below arises. In case of raising the degree of integration per chip of a semiconductor integrated circuit (IC), it is common practice that the degree of integration is raised with the power dissipation per chip left intact (usually, e.g. about 500 mW/chip). The reason is that the allowable power dissipation per chip is limited because an IC package for receiving one chip is ordinarily a package having 14 to 18 dual in-line pins.

In rendering the degree of integration high, accordingly, the power dissipation as a whole is usually made substantially the same value as the previous value. Therefore, the power dissipation per bit of the memory circuit must be lowered. When the memory cell in FIG. 1 is employed for a memory of 1 Kbits (1,024 bits)/chip, the sustaining current IST is made a value of e.g. 25 $\mu$A–50 $\mu$A/ bit, resulting in a value of approximately 25mA–50 mA for all the 1,024 bits. When a memory of 4,096 bits/chip is to be realized while keeping this value unchanged, the sustaining current per bit needs to be 6 $\mu$A–12$\mu$A or less. In case of reducing the sustaining current in this manner, in order to endow the transistors $Q_1'$ and $Q_0'$ of the memory cell with appropriate sustaining operation potentials, it is required to make the resistance value of the collector resistors $RC_1$ and $RC_0$ a high resistance value, for example, a value of about 100K$\Omega$.

However, in the case of intending to put the foregoing circuit into the high degree of integration by diminishing the sustaining current as described above, the readout of information becomes difficult as explained hereunder.

It is supposed by way of example that the transistor $Q_0'$ of the memory cell is in the "on" state, while the transistor $Q_1'$ is in the "off" state, and that the information is read out through the transistor $Q_0$. Assuming the readout current IR to be 0.5 mA and the current gain $h_{FE}$ of the transistor $Q_0$ to be 50 at this time, the base current of the transistor $Q_0$ becomes 10 $\mu$A (=0.5 mA/50). This base current causes a voltage drop across the 100K$\Omega''$ collector resistor $RC_1$, resulting in lowering the base potential of the transistor $Q_0$. In the absence of the diode $D_1$, a voltage drop which is as great as 1V will arise across the resistor $RC_1$. Owing to the presence of the diode $D_1$, however, the voltage drop of 0.8 V which agrees with the forward voltage thereof takes place. Accordingly, the potential of a nodal point $VC_1$ becomes:

$$VC_1 = VX_1 - 0.8 \text{ (V)}$$

On the other hand, the collector potential $VC_0$ of the transistor $Q_0$ turned "on" is clamped by the diode $D_0$ and therefore becomes:

$$VC_0 = VX_1 - 0.8 \text{ (V)}$$

so that $VC_1 = VC_0$. That is, assuming that the transistor $Q_0$ is turned "on", the transistor $Q_1$ is also turned "on". It is consequently impossible to design the memory cell so that the readout current IR may fully flow from the transistor $Q_0$ without destroying the content of the memory cell. In case of the 1 Kbit memory, the resistance of the resistor $RC_1$ is about 15KΩ, and hence:

$$VC_1 = VX_1 - 0.15 \text{ (V)}$$

$$VC_0 = VX_1 - 0.8 \text{ (V)}$$

Since $VC_1 > VC_0$, the normal readout is possible.

As understood from the foregoing, although the prior art memory cell illustrated in FIG. 1 is advantageous in that the readout currents can be made great owing to the function of the clamp diodes $D_0$ and $D_1$, it gives rise to the disadvantage that the large readout currents are impossible when a memory cell of large bit capacity is designed by suppressing the sustaining currents to below a certain degree.

SUMMARY OF THE INVENTION

An object of this invention is to provide an improved memory cell which can set the readout currents to be great even when the sustaining currents are made small and the collector resistances are made great.

A further object of this invention is to provide variable resistance element in the form of integrated circuit device for use in memory circuits.

Other objects and aspects of this invention will become apparent from the following description of embodiments with reference to the accompanying drawings.

DESCRIPTION OF THE PREFERRED EMBODIMENTS

Hereunder, this invention will be described in detail with reference to the drawings. A memory cell circuit based on this invention is shown in FIG. 2. Memory cell circuit of FIG. 2 is different from the prior art memory cell of FIG. 1 in that pnp transistors $Q_2$ and $Q_3$ added in parallel with the collector resistors $RC_0$ and $RC_1$. Owing to the addition of the pnp transistors, it becomes possible to design a memory cell with low sustaining currents and high readout currents. The reason is as stated below.

Let it now be supposed that the transistor $Q_0$ is turned "on" and that the readout current IR flows from the transistor $Q_0$ to the data line $LD_0$. Since both the collector resistance $RC_0$ and readout current IR are great in this case, the potential difference across both the terminals of the collector resistor $RC_0$ attempts to exceed the forward voltage of the clamp diode $D_0$, for example, 0.8 V. As a result, the clamp diode $D_0$ functions and carries out the clamp operation so as to establish $VX_1 - VC_0 = 0.8$ V. On the other hand, the transistor $Q_3$ attains the "on" state because the base-emitter voltage thereof becomes equal to the terminal voltage 0.8 V of the resistor $RC_0$. The collector current of the transistor $Q_3$ at this time flows in parallel with the resistor $RC_1$. Accordingly, a base current to be supplied to the transistor $Q_0$ becomes equal to the sum between a current flowing through the resistor $RC_1$ and the collector current of the transistor $Q_3$, and the potential difference across the resistor $RC_1$ decreases noticeably. Thus, even when the readout current IR is set to be high, the potential difference of $(VX_1 - VC_1)$ can be made small, and the desired end can be achieved.

Figure 2:
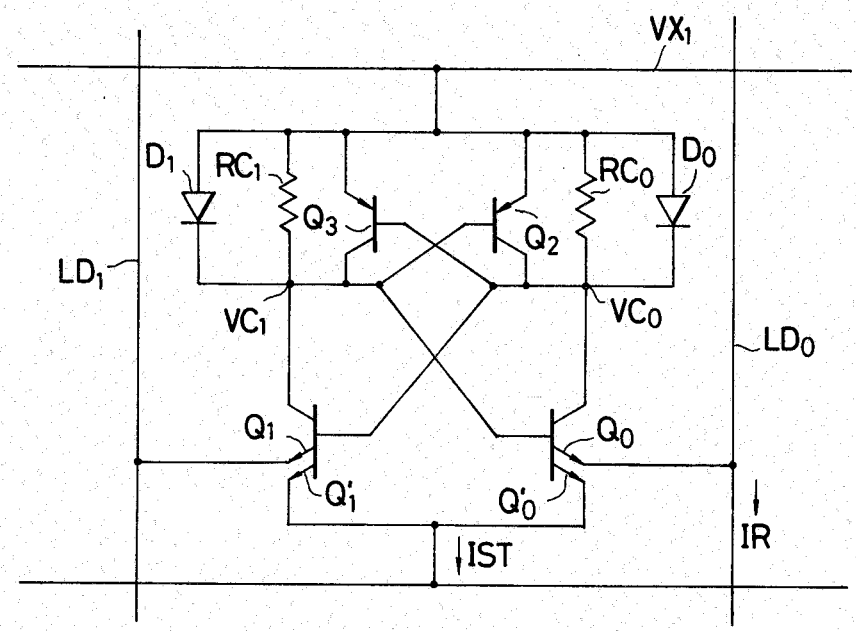
FIGS. 2 and 3 are circuit diagrams of memory circuits of embodiments respectively.
Figure 3:
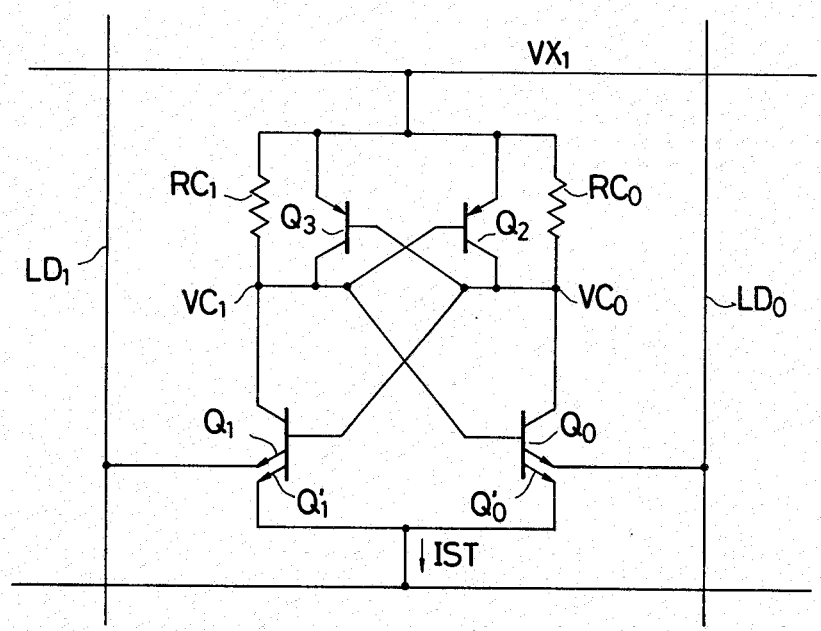

In the memory cell circuit of FIG. 2, the forward direction of the diode $D_1$ and the forward direction of the base-emitter path of the transistor $Q_2$ are identical. Likewise, the forward directions of the diode $D_0$ and the base-emitter path of the transistor $Q_3$ are identical. It is accordingly possible to remove the clamp diodes $D_0$ and $D_1$ from the circuit of FIG. 2. In a memory cell circuit in FIG. 3, no independent clamp diode is used. In FIG. 3, the functions of the clamp diodes $D_0$ and $D_1$ in FIG. 2 are respectively executed by the emitter-base PN junctions of the transistors $Q_3$ and $Q_2$.

As a memory cell, in case where the resistors $RC_0$ and $RC_1$ are removed from the memory cell circuit of FIG. 3, it is difficult to put the memory cell into practical use for such reasons that its characteristics are greatly influenced by the grounded-emitter current gains $h_{FE}$ of the transistors, and hence such a memory circuit will be excluded from aspects of this invention.

Since the collector resistors $RC_0$ and $RC_1$ exist in the memory cell circuit of FIG. 3, the stability of the operation is attained.

In memories of semiconductor integrated circuits, when the number of elements in a memory cell circuit is large in integrating a large number of bits in one chip and the occupying area of the elements in the chip becomes large accordingly, an increase in the chip size and a rise in the manufacturing cost are incurred. The memory cell circuits shown in FIGS. 2 and 3 have the construction in which the pnp transistors are added to the memory cell circuit of FIG. 1, but these pnp transistors can be formed as structures integral with the resistors $RC_0$ and $RC_1$ as will be explained below. As a result, the occupying area of each of the memory cell circuits in FIGS. 2 and 3 can be made approximately equal to that of the prior-art memory cell in FIG. 1.

Figure 1:
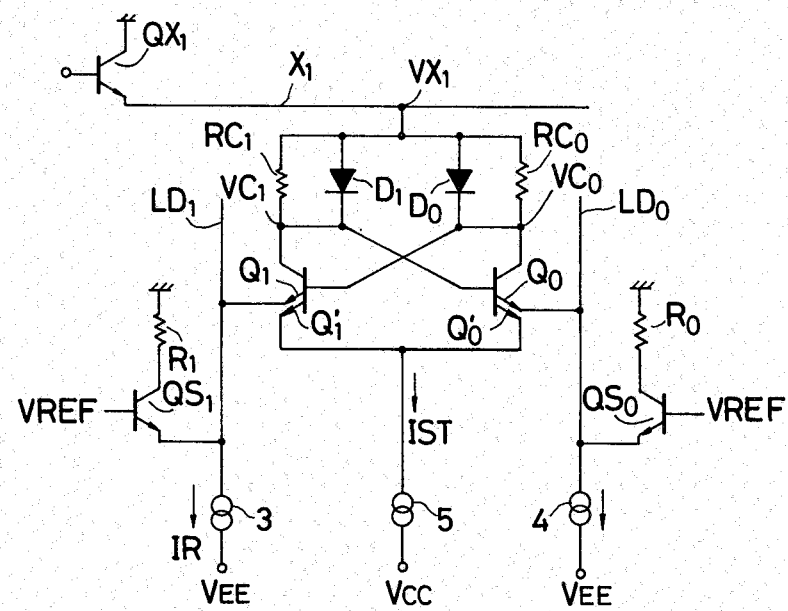
FIG. 1 is a circuit diagram of a prior-art memory circuit.
Figure 4A:
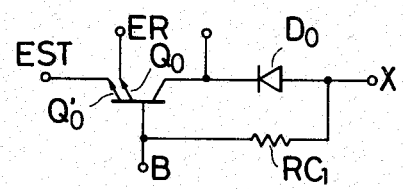
FIG. 4A is a circuit diagram of a circuit which constructs a half of the memory circuit in FIG. 1.
Figure 4B:
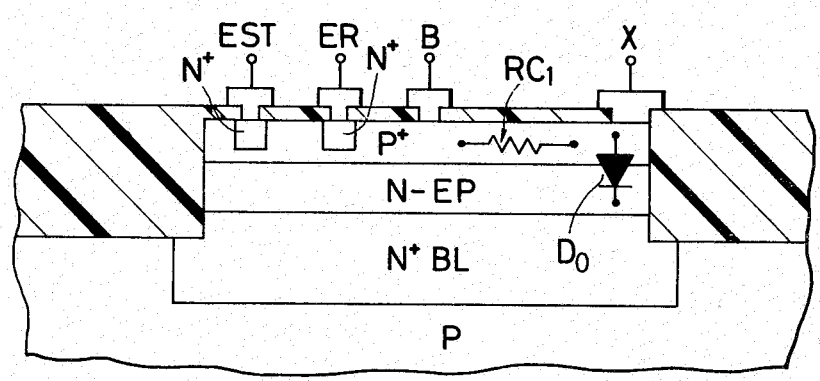
FIG. 4B is a sectional view at the time when the circuit in FIG. 4A is put into an IC.

Shown in FIG. 4A is a circuit corresponding to a half of the prior-art memory cell illustrated in FIG. 1. By connecting terminals C and terminals B of two such circuits and coupling terminals X and terminals EST thereof with each other, the complete memory cell shown in FIG. 1 can be formed. FIG. 4B shows a sectional view in the case where the circuit of FIG. 4A is constructed in the form of a semiconductor integrated circuit (hereinafter, abbreviated to "IC") of the oxide-film isolation type. N+BL designates a buried layer of N-type conductivity, which forms the collectors of the transistors $Q_0$ and $Q_0'$ together with an epitaxial layer of N-type conductivity (N-EP). A P+-layer in the vicinity of the two emitters EST and ER acts as the bases of the transistors $Q_0$ and $Q_0'$, and a lead-out port of the bases is indicated at B. The part of the P+-layer between the terminal B and the terminal X acts as the collector resistor $RC_1$. As the diode $D_0$, a diode formed between the P+-layer and the N-type epitaxial layer underneath the terminal X is utilized. By forming the constituent elements of the memory cell as the integral structure in this manner, the occupying area of the memory cell can be made small. Although the collector terminal C is not shown in FIG. 4B, it is led out on the surface of the chip by a highly doped layer of N-type conductivity connected with the N+BL layer.

Figure 5A:
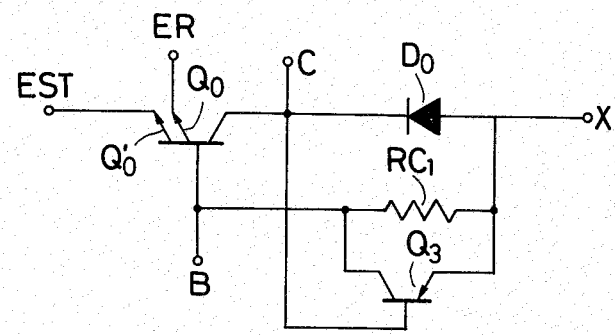
FIG. 5A is a circuit diagram of a circuit which constructs a half of the memory circuit in FIG. 2 or 3.

FIGS. 5A through 7D are views of an IC of an embodiment which constructs the memory cell circuit shown in FIGS. 2 or 3. A unit block of FIG. 5B showing a section viewed along a—a' in FIG. 7D includes a half of the constituent elements of the memory cell circuit in FIGS. 2 or 3 as illustrated in FIG. 5A.

Figure 5B:
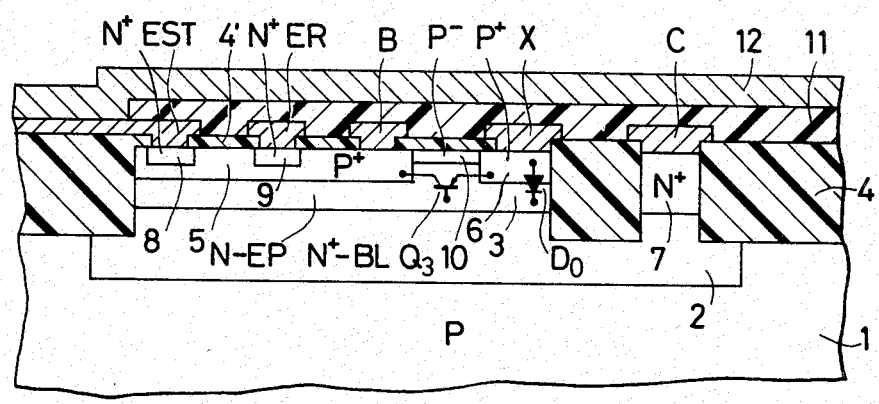
FIG. 5B is a sectional view at the time when the circuit in FIG. 5A is put into an IC.

Referring to FIG. 5B, an N-type buried layer of low specific resistance N+BL and an N-type epitaxial layer of high specific resistance N-EP form the collectors of the transistors $Q_0$ and $Q_0'$, and they also function as the base of the PNP transistor $Q_3$. A P+-region adjoining the terminal x and a P+-region adjoining the terminal B are connected by a P−-region which forms the high resistance $RC_1$. The P+-regions adjoining the terminal X and the terminal B function as the emitter and collector of the PNP transistor $Q_3$, respectively. The diode $D_0$ is formed of the P+-region adjoining the terminal X and the N-EP region, and it is essentially constructed of the base-emitter junction of the transistor $Q_3$.

Figure 6:
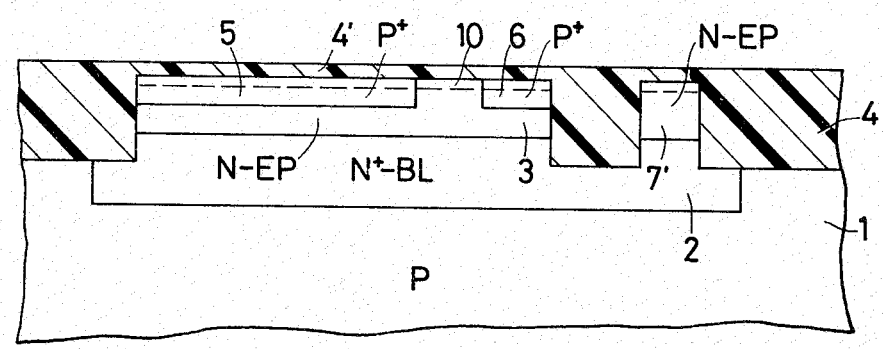
FIG. 6 is a sectional view in the course of the manufacture of the IC in FIG. 5B.

Shown is in FIG. 6 a sectional view in the course of the manufacture of the IC.

FIGS. 7A to 7D are pattern views of an IC in which a plurality of memory cells each consisting of a pair of unit blocks are arrayed. Unit blocks $U_{110}$ and $U_{111}$ form a pair. Likewise, unit blocks $U_{120}$ and $U_{121}$, $U_{210}$ and $U_{211}$, and $U_{220}$ and $U_{221}$ form pairs respectively.

In the plan view of FIG. 7, A, only the semiconductor junction pattern of each unit block is indicated by solid lines. In the figure, the same symbols as in FIG. 5, B represent the same semiconductor regions.

Figure 7A:
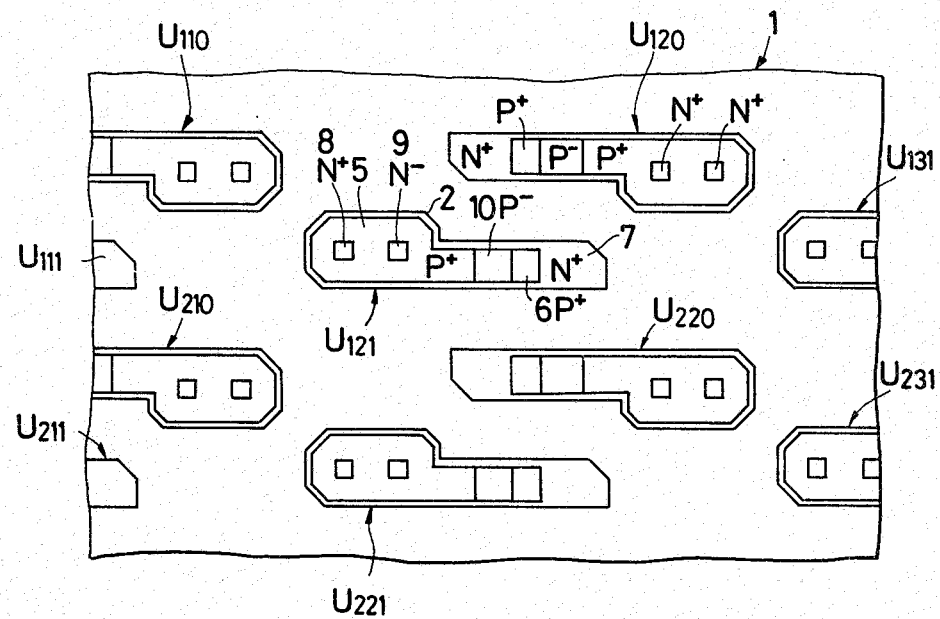
FIGS. 7A through 7D are plan views for explaining an IC which constructs a memory circuit.
Figure 7B:
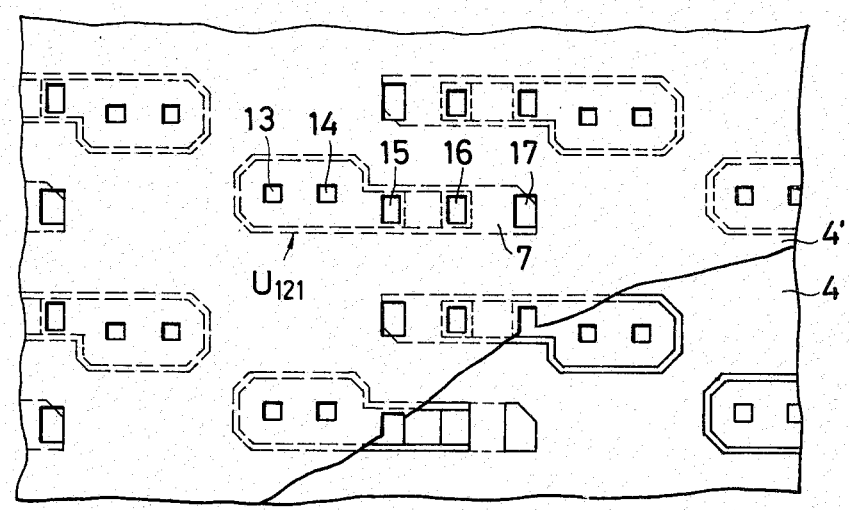

In the partially-developed plan view of FIG. 7B, the pattern of contact holes which are formed in a thin oxide film 4' overlying the semiconductor regions of each unit block is indicated by solid lines. More specifically, contact holes 13 to 17 are provided for the electrodes EST, ER, B, X and C in FIG. 5B. In FIG. 7, B, a thick oxide film is arranged on a side of a collector region 7 as apparent also from FIG. 5B, and it remains even in the case of forming the contact holes in the thin oxide film. Therefore, a portion of the contact hole 17 lying beyond the collector region 7 as shown in FIG. 7B may be present. The pattern of the semiconductor regions in FIG. 7A is indicated by broken lines on the upper side of FIG. 7B, and by solid lines in the developed part on the lower right side thereof.

The partially-developed plan view of FIG. 7, C shows the pattern of interconnections and the pattern of through-holes provided in an oxide film 11 covering the electrodes. One-dot chain lines on the upper side of FIG. 7, C and solid lines in the developed part on the right lower side thereof indicate the interconnection pattern, while solid lines on the upper side indicate the contact holes. The electrodes B, X and C of the unit block $U_{120}$ and the electrodes C, X and B of the unit block $U_{121}$ are correspondingly connected by the respective interconnections. Similarly, the unit blocks $U_{220}$ and $U_{221}$ are connected to each other. The electrodes ER of the unit blocks $U_{121}$ are connected to the interconnection $LD_{12}$, and the electrodes of the unit blocks $U_{120}$ and $U_{220}$ are similarly connected to the interconnection $LD_{02}$.

Figure 7C:
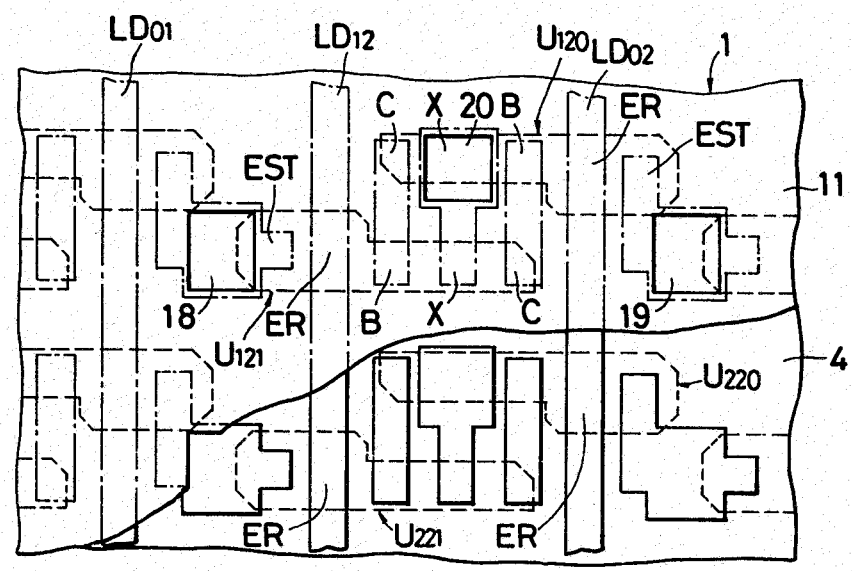
Figure 7D:
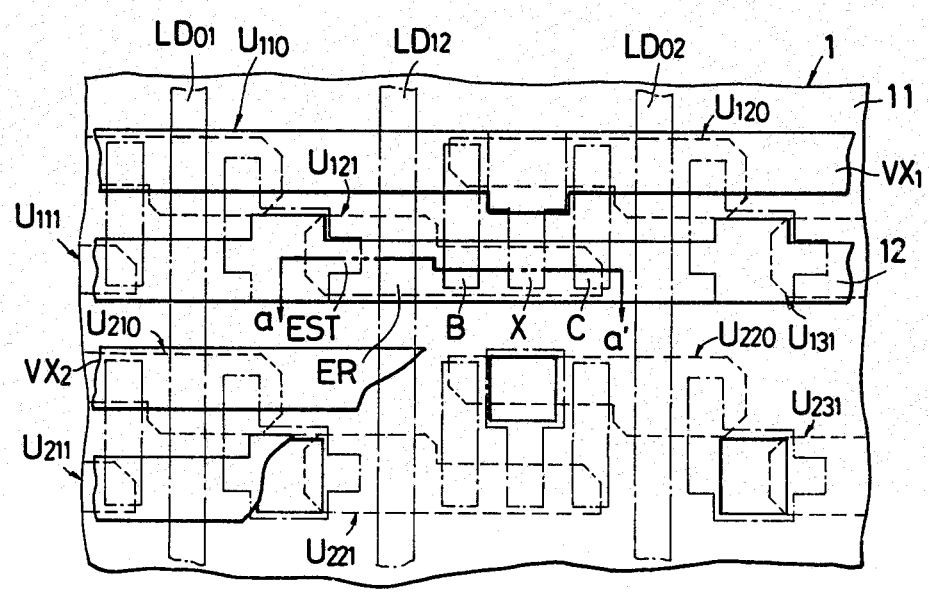

The partially-developed plan view of FIG. 7D shows the pattern of interconnections at the second layer. An interconnection $VX_1$ is connected to the electrodes X of the unit blocks $U_{120}$ and $U_{121}$ via a through-hole 20. An interconnection 12 is connected to the electrodes EST of the unit blocks $U_{120}$ and $U_{121}$ via through-holes 18 and 19, respectively.

The memory cell composed of the unit blocks $U_{110}$ and $U_{111}$ and the memory cell composed of the unit blocks $U_{120}$ and $U_{121}$ are arranged in the same row, and the memory cell composed of the unit blocks $U_{120}$ and $U_{121}$ and the memory cell composed of the unit blocks $U_{220}$ and $U_{221}$ are arranged in the same column. The memory cells in the same row are connected to the word line $VX_1$ in common, and the memory cells in the same column are connected to the data lines $LD_{12}$ and $LD_{02}$ in common.

The IC of the above embodiment is fabricated with the oxide-film isolation technique as stated previously.

In the fabrication, first of all, a P-type silicon single crystal substrate 1 is prepared, and antimony is diffused into a selected area of the surface of the substrate as an N-type impurity so as to form the N-type buried layer of low specific resistance. Subsequently, the silicon epitaxial layer is formed on the whole surface of the buried layer. An oxidation-resisting mask made of $Si_3N_4$ is formed on a selected area of the epitaxial layer. By heating the resultant substrate in an oxidizing atmosphere, the thick selective oxidation film is formed. After removing the oxidation-resisting mask, the thin oxide film is formed on the exposed surface of the epitaxial layer by the thermal oxidation. A photoresist film which has openings on portions to form the P-type regions 5 and 6 (FIG. 5, B) therein is formed on the substrate including the epitaxial layer, and it is used as a mask for the ion implantation of an impurity. Boron is ion-implanted from the openings of the photoresist film through the thin oxide film into the epitaxial layer.

The resist film is removed, and boron ions are implanted into the whole surface of the substrate at a low concentration. As a result, the high resistance region 10 continuous to the P-type regions 5 and 6 is formed in the surface of the epitaxial layer between the regions 5 and 6.

A silicon oxide film is formed on the entire surface of the substrate by the CVD process, whereupon the oxide film which overlies an epitaxial layer 7' to be used as a collector contact region is removed by the photoetching. Phosphorus is diffused into the layer 7', as an N-type impurity.

The oxide film which overlies portions to form emitter regions 8 and 9 (FIG. 5B; FIG. 7A therein is selectively removed, and arsenic is diffused from the openings into the surface of the P-type base region 5, whereby the emitter regions 8 and 9 are formed.

The contact holes 13—17 (FIG. 7B) are provided in the oxide film, and the aluminum interconnections and electrodes having a thickness of 1$\mu$ are formed (FIG. 7C).

The silicon oxide film 11 is formed by the CVD process on the whole surface of the substrate including the electrodes, and contact holes 18 and 19 (FIG. 7, C) are formed in the oxide film 11.

The aluminum interconnections $VX_1$, $VX_2$ and 12 at the second layer are formed (FIG. 7, D). Thus, the IC is completed.

As apparent from FIG. 5, B, the high resistance $RC_1$, the PNP transistor $Q_3$ and the diode $D_0$ can be formed as the integral structure. It is evident that the occupying area does not increase as compared with the same of the high resistance $RC_1$ and the diode $D_0$ in FIG. 4, A. In this manner, the memory cell circuit of this invention has the advantage that the characteristics are more excellent than those of the prior-art memory cell circuit, nevertheless the occupying area being approximately equal.

Figure 8:
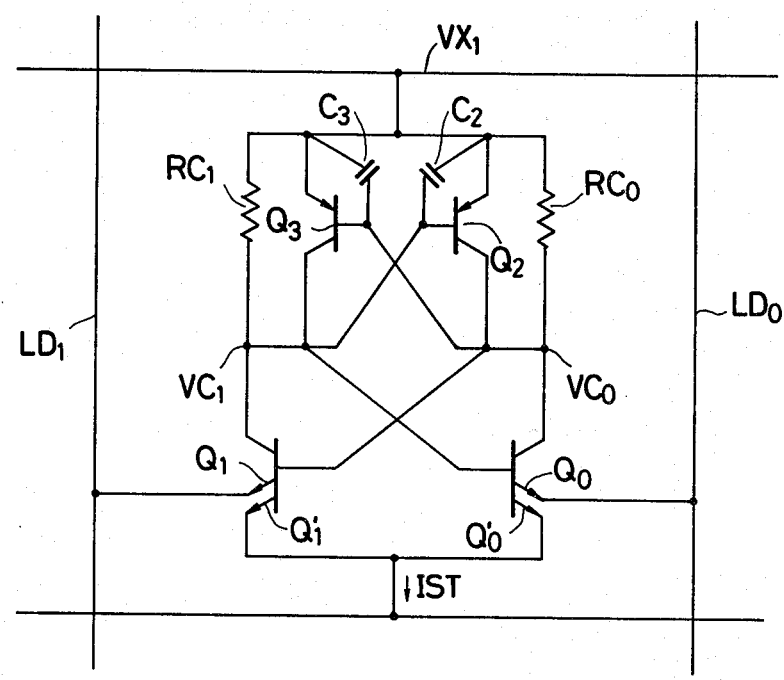
FIG. 8 is a circuit diagram of a memory circuit of another embodiment.

FIG. 8 shows a circuit diagram of another embodiment of the memory circuit based on this invention. This embodiment is such that, in the memory circuit of FIG. 2, capacitors $C_2$ and $C_3$ are respectively interposed between the bases and emitters of the transistors $Q_2$ and $Q_3$. By interposing the capacitors $C_2$ and $C_3$, the collector potential $VC_0$ or $VC_1$ becomes capable of responding to a variation in the word line $VX_1$ at high speed, and the enhancement of the operating speed of the circuit and the increase of the operating margin of the memory cell can be expected. Sectional views of embodiments in the cases of constructing the present memory circuit as semiconductor integrated circuits are respectively shown in FIGS. 9 to 11. In any of the cases, the capacitors $C_2$ and $C_3$ are formed as the base-emitter junction capacitances of the PNP transistors $Q_2$ and $Q_3$ and are constructed so as to make the junction capacitances large.

Figure 9:
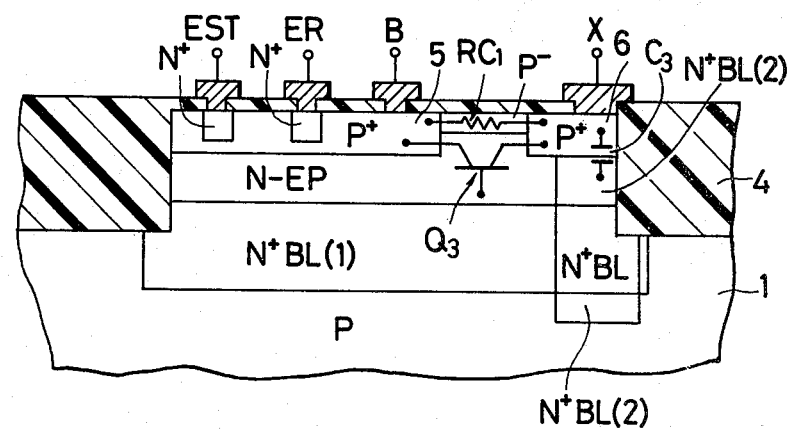
FIGS. 9, 10 and 11 are sectional views at the time when the circuit in FIG. 8 is put into IC's, respectively.

The embodiment of FIG. 9 is provided with layers $N^+BL_{(1)}$ and $N^+BL_{(2)}$ as buried layers of N-type conductivity. Arsenic (As) or antimony (Sb) having a small coefficient of diffusion is employed as a conductivity type determining impurity for forming the layer $N^+BL_{(1)}$, while phosphorus (P) having a large coefficient of diffusion is employed for the layer $N^+BL_{(2)}$. Owing to such a difference of the impurities, the phosphorus of the layer $N^+BL_{(2)}$ is diffused faster into the silicon substrate and the epitaxial layer by a subsequent heat treatment in the selective oxidation, the emitter diffusion or the like. As a result, the layer $N^+BL_{(2)}$ comes into contact with the P+-layer adjoining the terminal X, and the high junction capacitance $C_3$ is formed between the layer $N^+BL_{(2)}$ and the P+-layer 6.

Figure 10:
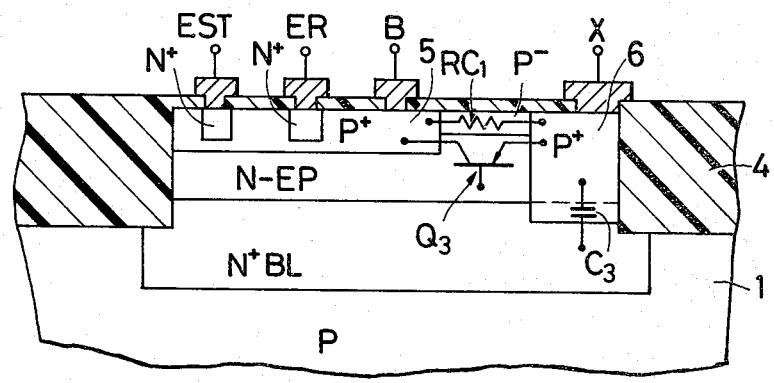

In the embodiment of FIG. 10, the P+-layer 6 adjoining the terminal X is formed at a junction depth greater than that of the P+-layer adjoining the terminal B and is held in contact with the $N^+BL$ layer.

Figure 11:
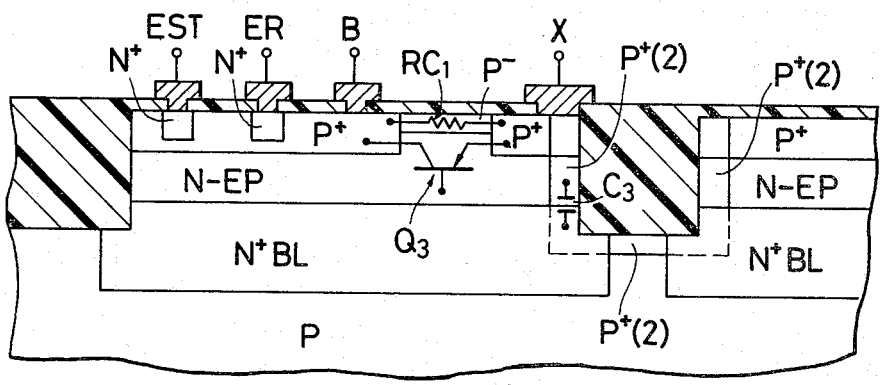

The embodiment of FIG. 11 is provided with another P+-layer $P^+_{(2)}$ for forming a capacitor. By forming it so as to contact with the $N^+BL$ layer and the P+-layer adjoining the terminal X, the capacitor is formed.

Figure 12A:
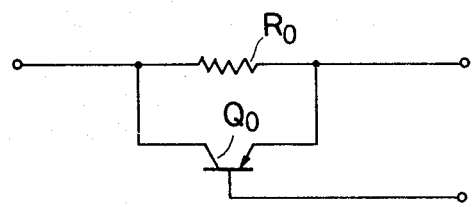
FIG. 12A is a circuit diagram of a variable impedance circuit.
Figure 12B:
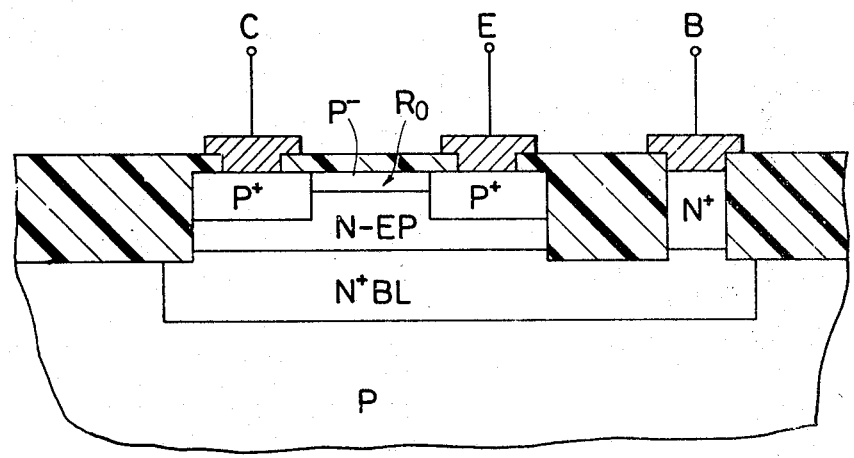
FIG. 12B is a sectional view at the time when the circuit in FIG. 12A is put into an IC.
Figure 12C:
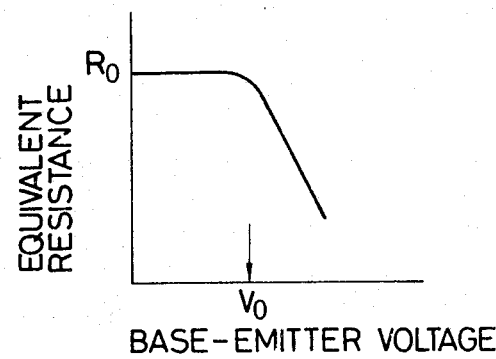
FIG. 12C is a characteristic curve diagram of the circuit in FIG. 12A.

Now, the second essential point of this invention will be described. FIG. 12 takes out and shows the part of the high resistance $RC_1$ and the transistor $Q_3$ of the memory cell in FIG. 5A. FIG. 12A shows a circuit diagram, and FIG. 12B shows an integrated state of the circuit in FIG. 12A. The high resistance and the transistor are put into an integral structure, and are constructed in a small occupying area. The integral structure forms the second essential point of this invention.

An equivalent resistance between E and C of the element illustrated in FIG. 12A exhibits a value $R_0$ in a case where no carrier is injected from the emitter or collector of the transistor $Q_0$. However, it becomes a conspicuously low resistance when, for example, the carrier injection from the emitter is carried out. This is as illustrated in FIG. 12, C. That is, the semiconductor device in FIG. 12, B can be employed as a variable resistor. Moreover, it is suited to a semiconductor integrated circuit because of the small occupying area.

Examples of applications of the variable resistance device will now be described.

Figure 13:
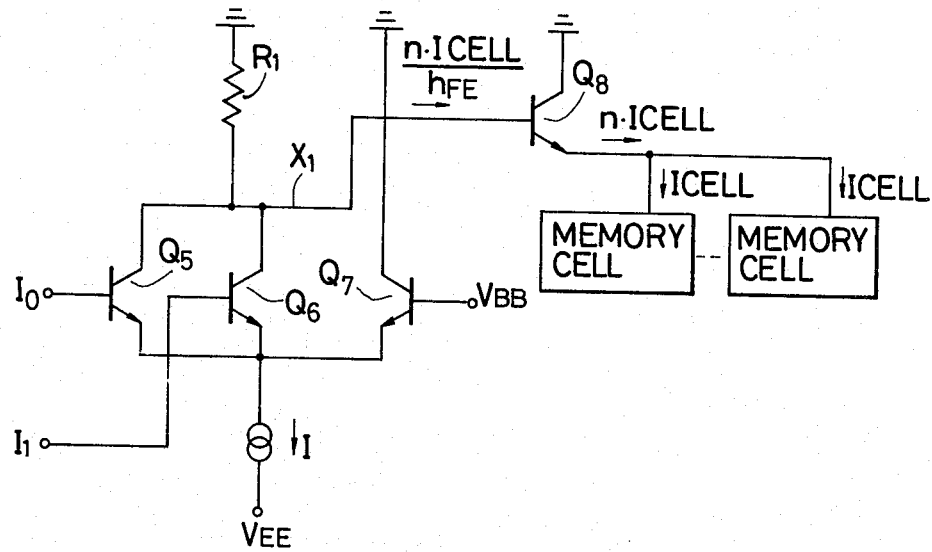
FIG. 13 is a circuit diagram of a part of a memory circuit.

FIG. 13 shows a part of a memory circuit. Transistors $Q_5$–$Q_8$ constitute a driver circuit for a memory cell row. When both input signals $I_0$ and $I_1$ are at a low level, the common collector point $X_1$ of the transistors $Q_5$ and $Q_6$ become a high level, and the transistor $Q_8$ drives and selects the memory cell row. When either or both of the input signals $I_0$ and $I_1$ is/are at the high level, the potential of the point $X_1$ lies at the low level, and the transistor $Q_8$ keeps the memory cell row at the low level and holds it in the non-selected state. That is, the transistors $Q_5$, $Q_6$ and $Q_7$ decode the inputs $I_0$ and $I_1$. In case where the memory circuit has a large number of bits integrated, a current of n.ICELL (ICELL denoting a current to flow through one memory cell) to flow through n cells flows through the driver $Q_8$. Accordingly, letting $h_{FE}$ denote the forward current gain of the transistor $Q_8$, a current of n.ICELL/$h_{FE}$ flows to the base of the transistor $Q_8$. Since the base current flows through a comparatively high resistance $R_1$, a potential difference arises across the resistance $R_1$ and its value is great. This potential difference disperses depending on $h_{FE}$ of the transistor $Q_8$, resulting in the dispersion of the potential at the point $X_1$. In consequence, the operating margin of the memory circuit decreases.

Figure 14:
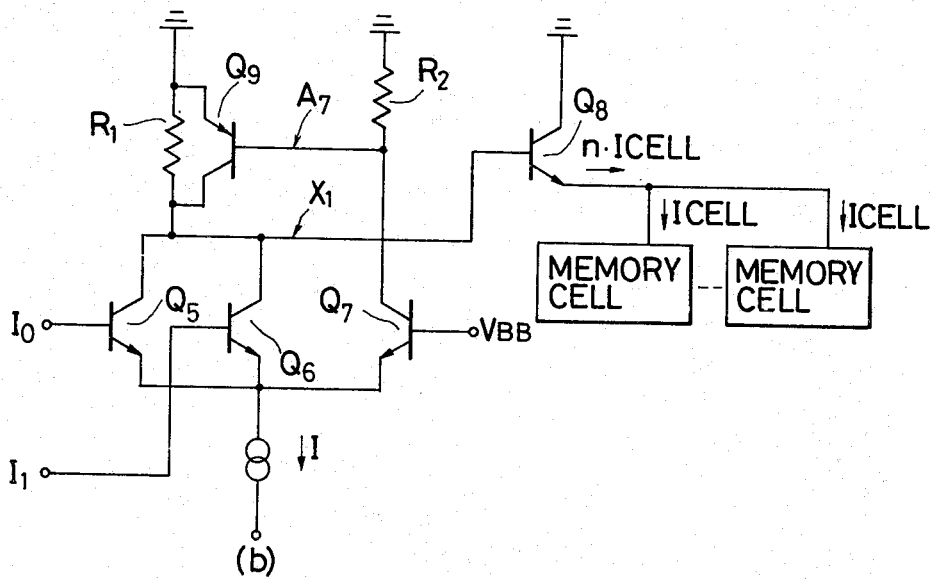
FIG. 14 is a circuit diagram of a memory circuit of another embodiment.

Devised as a countermeasure is a driver circuit in FIG. 14. A PNP transistor $Q_9$ is connected in parallel with the resistance $R_1$, and its base is driven by a resistance $R_2$ and the collector of the transistor $Q_7$. Thus, when the point $X_1$ has become the high level, a current $I_1$ flows through the transistor $Q_7$ to bring the potential of a point $A_7$ into the low level, and the transistor $Q_9$ can be turned "on" by appropriately selecting the values of $R_2$ and $I_1$ in advance. Then, the current to flow through the resistance $R_1$ shunts through the transistor $Q_9$, the equivalent impedance viewed across the resistance $R_1$ becomes noticeably small, and the potential drop of the high level of the point $X_1$ as based on the base current of the transistor $Q_8$ becomes small.

Figure 15:
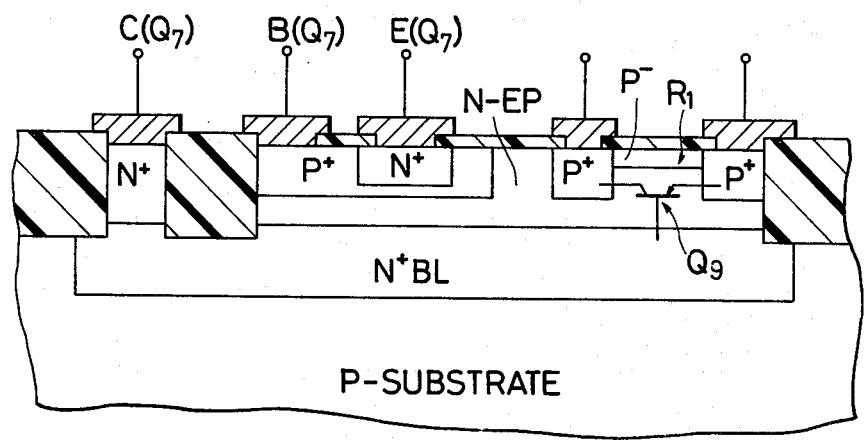
FIG. 15 is a sectional view at the time when the circuit in FIG. 14 is put into an IC.

The driver circuit of FIG. 14 can have its occupying area made small and is suitable for a large-scale integration when the elements $Q_7$, $R_1$ and $Q_9$ are formed as an integral structure as illustrated in FIG. 15.

Figure 16:
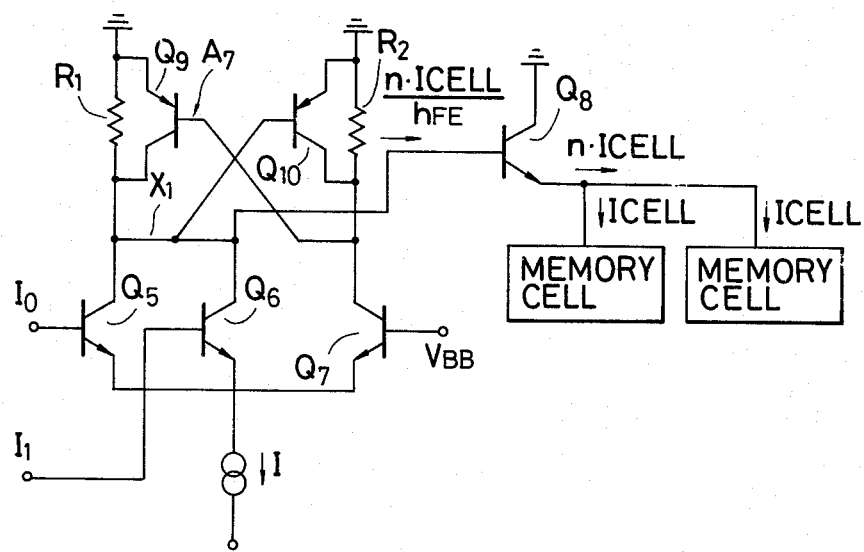
FIG. 16 is a circuit diagram of a memory circuit of another embodiment.

FIG. 16 illustrates a modification of the driver circuit shown in FIG. 14. A PNP transistor $Q_{10}$ is disposed in parallel with the resistance $R_2$ for driving the base of the transistor $Q_9$. When the point A is changed from the low level to the high level, stored charges in the base of the transistor $Q_9$ are removed through the transistor $Q_{10}$ besides through the resistance $R_2$, so that high-speed switching can be expected. With the circuit of FIG. 16, however, when the potential of the point $X_1$ drops, it does not drop below about 0.8 volt because of the function of the base-emitter diode of the transistor $Q_{10}$ as a clamp diode, so that the amplitude of the potential at the point $X_1$ is subject to limitation.

Although the circuits of FIGS. 14 and 16 are examples as the drivers of the memory cell circuits, it goes without saying that the invention is extensively usable for ordinary current switching logic circuits. An example is shown in FIG. 17.

It is apparent from the description thus far made that, at this time, elements $R_{901}$, $Q_{903}$ and $Q_{902}$ or elements $R_{902}$, $Q_{904}$ and $Q_{901}$ can be formed as an integral structure.

Figure 17:
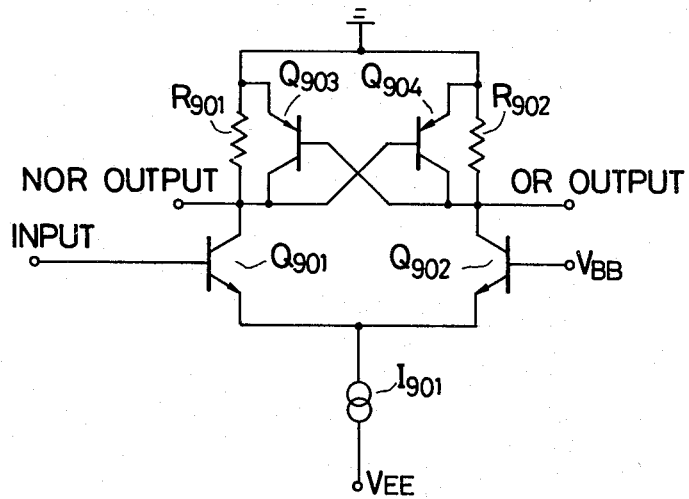
FIGS. 17 and 18 are circuit diagrams of current switching circuits of embodiments, respectively.
Figure 18:
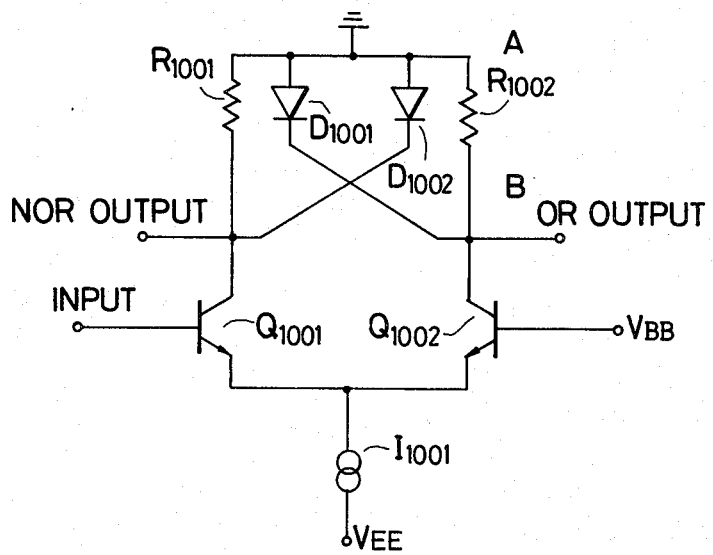

Shown in FIG. 18 is a modification of the circuit of FIG. 17. It corresponds to an extreme case where the emitter current gains of the transistors $Q_{903}$ and $Q_{904}$ are made small and where the transistor operations are not executed, and the transistors $Q_{903}$ and $Q_{904}$ become diodes $D_{1001}$ and $D_{1002}$ respectively. With the present circuit, the impedances as viewed across resistances $R_{1001}$ and $R_{1002}$ are not variable, but the clamping effect of the diodes $D_{1001}$ and $D_{1002}$ prevents the saturation of transistors $Q_{1001}$ and $Q_{1002}$ and makes high-speed switching possible. Also in the present circuit, the elements $R_{1001}$, $D_{1001}$ and $Q_{1002}$ and the elements $R_{1002}$, $D_{1002}$ and $Q_{1001}$ can be formed as integral structures, respectively.

What is claimed is:

1. A memory cell comprising:
   first and second multi-emitter transistors of one conductivity type each having first and second emitters, a base and a collector, said first emitters of the multi-emitter transistors being commonly connected to a first current source allowing a sustaining current to flow therethrough, said second emitters of the multi-emitter transistor being respectively connected to respective ones of a pair of second current sources each allowing a readout current larger than said sustaining current to flow therethrough, said base of the first transistor being connected to said collector of the second transistor, said base of the second transistor being connected to said collector of the first transistor;
   a node for receiving an operating potential;
   a third transistor of the opposite conductivity type to said first and second transistors, whose base is connected to the collector of said second transistor, whose collector is connected to the collector of said first transistor, and whose emitter is connected to said node;
   a fourth transistor of the same conductivity type as said third transistor, whose base is connected to the collector of said first transistor, whose collector is connected to the collector of said second transistor, and whose emitter is connected to said node;
   a first resistor connected between the collector and emitter of said third transistor, the resistance value of said first resistor being so selected that a voltage drop, appearing across said first resistor as a result of a base current of said second transistor in the "on" state in a readout operation mode, is larger than the base-emitter forward voltage of said fourth transistor in the case where said third transistor is disconnected from said first resistor;
   a second resistor connected between the collector and emitter of said fourth transistor, the resistance value of said second resistor being so selected that a voltage drop, appearing across said second resistor as a result of a base current of said first transistor in the "on" state in a readout operation mode, is larger than the base-emitter forward voltage of said third transistor in the case where said fourth transistor is disconnected from said second resistor; and
   wherein the third transistor operates in the "on" state so that a voltage drop, appearing across said first resistor as a result of the base current of said second transistor in the "on" state in the readout operation mode, is smaller than the base-emitter forward voltage of said fourth transistor, while the fourth transistor operates in the "on" state so that the voltage drop, appearing across said second resistor as a result of the base current of said first transistor in the "on" state in the readout operation mode, is smaller than the base-emitter forward voltage of said third transistor.

2. A memory cell according to claim 1, wherein each of said third and fourth transistors is constructed of a first semiconductor region serving as the base of a first conductivity type which is formed in a semiconductor substrate of a second conductivity type and extends to a main surface of said semiconductor substrate; and second and third semiconductor regions respectively serving as the emitter and collector of the second conductivity type which are formed in said first semiconductor region adjacent to but closely spaced from each other and extend to said main surface of the semiconductor substrate; and wherein the first resistance means is constructed of a thin semiconductor region of the second conductivity type which is formed in said first semiconductor region disposed between said second and third semiconductor regions of said third transistor less deeply and extends to the depth shallower than that of said second and third semiconductor regions of the third transistor from said main surface of the semiconductor substrate of the third transistor while said second resistance means is constructed of a thin semiconductor region of the second conductivity type which is formed in said first semiconductor region disposed between said second and third semiconductor regions of said fourth transistor and extends to the depth shallower than that of said second and third semiconductor regions of said fourth transistor from said main surface of the semiconductor substrate of the fourth transistor.

3. A memory cell according to claim 2, wherein a part of said first semiconductor region of said fourth transistor and a part of said third semiconductor region thereof serve as the collector and base of said first transistor, respectively, while a fourth semiconductor region of said first conductivity type formed in said third semiconductor region of said fourth transistor serves as the emitter of said first transistor; and wherein a part of said first semiconductor region of said third transistor and a part of said third semiconductor region thereof serve as the collector and base of said second transistor, respectively, while a fourth semiconductor region of said first conductivity type formed in said third semiconductor region of said third transistor serves as the emitter of said second transistor.

4. A memory cell according to claim 3, wherein said first semiconductor region of said each third and fourth transistor is formed of a heavily-doped region with said first conductivity type beneath said second semiconductor region, thereby providing a capacitance between said second semiconductor region and said heavily-doped region.

* * * * *